United States Patent
Okouchi et al.

(10) Patent No.: US 10,184,975 B2
(45) Date of Patent: Jan. 22, 2019

(54) PRINTED BOARD WITH WIRING PATTERN FOR DETECTING DETERIORATION, AND MANUFACTURING METHOD OF THE SAME

(71) Applicant: FANUC Corporation, Yamanashi (JP)

(72) Inventors: Yuichi Okouchi, Yamanashi (JP); Norihiro Saido, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 421 days.

(21) Appl. No.: 14/867,434

(22) Filed: Sep. 28, 2015

(65) Prior Publication Data

US 2016/0091557 A1  Mar. 31, 2016

(30) Foreign Application Priority Data

Sep. 29, 2014  (JP) ................. 2014-199005

(51) Int. Cl.
  *G01R 31/28* (2006.01)
  *H05K 1/02* (2006.01)
  *H05K 3/46* (2006.01)

(52) U.S. Cl.
  CPC ..... *G01R 31/2818* (2013.01); *G01R 31/2805* (2013.01); *H05K 1/0296* (2013.01); *H05K 3/4664* (2013.01)

(58) Field of Classification Search
  CPC ............ G01R 31/2818; G01R 31/2805; H05K 1/0296; H05K 3/4664
  USPC ............................................. 324/244; 349/12
  See application file for complete search history.

(56) References Cited

U.S. PATENT DOCUMENTS

2010/0327435 A1* 12/2010 Nakamura ........ H01L 23/49811
  257/737
2014/0340596 A1* 11/2014 Kim ........................ G06F 3/044
  349/12

FOREIGN PATENT DOCUMENTS

| JP | 2-2316 B2 | 1/1990 | |
|---|---|---|---|
| JP | H10-62476 A | 3/1998 | |
| JP | 2001-251026 A | 9/2001 | |
| JP | 2001251026 | * 9/2001 | ............... H05K 1/02 |
| JP | 2001-358429 A | 12/2001 | |
| JP | 2002-158413 A | 5/2002 | |
| JP | 2007-103495 A | 4/2007 | |
| JP | 2009-111144 A | 5/2009 | |
| JP | 2011-119567 A | 6/2011 | |

OTHER PUBLICATIONS

Office Action in JP Application No. 2014-199005, dated Nov. 17, 2015.

(Continued)

*Primary Examiner* — Farhana Hoque
(74) *Attorney, Agent, or Firm* — Hauptman Ham, LLP

(57) ABSTRACT

A printed board with a wiring pattern for detecting deterioration includes an insulating substrate, a wiring pattern group that is formed on the insulating substrate and includes a wiring pattern for detecting deterioration; and a solder resist covering the wiring pattern group, in which the board has a thin film section, and a thick film section in which a thickness of the solder resist is larger than the thin film section, and the wiring pattern for detecting deterioration is formed in the thin film section whose entire surrounding area or partial surrounding area is surrounded by the thick film section.

11 Claims, 4 Drawing Sheets

(56) References Cited

OTHER PUBLICATIONS

Office Action in JP Application No. 2014-199005, dated Apr. 5, 2016.

* cited by examiner

PRINTED BOARD WITH WIRING PATTERN FOR DETECTING DETERIORATION, AND MANUFACTURING METHOD OF THE SAME

RELATED APPLICATIONS

The present application claims priority to Japanese Application Number 2014-199005, filed Sep. 29, 2014, the disclosure of which is hereby incorporated by reference herein in its entirety.

BACKGROUND OF THE INVENTION

1. Field of the Invention

The present invention relates to a printed board for mounting electronic components, such as LSIs, capacitors and resistors, thereon, in particular to a printed board including a wiring pattern for detecting deterioration of a printed board early, and to a manufacturing method of the printed board.

2. Description of the Related Art

Industrial machines, such as machine tools, are required to maintain reliability for a long period of time. However, deterioration of a printed board inside a machine due to environmental stress is inevitable. For example, under a plant environment where industrial machines are used, mist caused by cutting liquid which is generated with a processing of a workpiece enters a housing of electric and electronic devices, such as a controller, and is attached on a surface of a printed board on which electronic components are mounted. There is a problem that the mist deteriorates a wiring pattern formed on the printed board due to corrosion or electric corrosion to cause a failure of electric and electronic devices.

As a method for detecting such deterioration of the printed board, there is a known art that a wiring pattern for detecting deterioration having a structure that deteriorates earlier than a regular wiring pattern is previously provided for the printed board, and advance detection of deterioration is made possible before a regular function of the printed board is impaired by monitoring electronic properties of the wiring pattern for detecting deterioration.

FIG. 10 is a view showing a cross-sectional structure of a printed board on which a conventional wiring pattern for detecting deterioration is formed. In a printed board 1, a wiring pattern 3 for detecting deterioration is formed on a surface of an insulating substrate 4.

The surface of the insulating substrate 4 on which the wiring pattern 3 for detecting deterioration is formed is covered by solder resist 2 together with the wiring pattern 3 for detecting deterioration.

As a structure of the wiring pattern for detecting deterioration in prior art, Japanese Unexamined Patent Application Publication No. 2001-251026 discloses a wiring with a narrower width than other wirings and a wiring with a narrower insulating gap. Further, Japanese Unexamined Patent Application Publication No. 2001-358429 discloses a structure in which solder resist on the wiring pattern for detecting deterioration is formed into a thin film. Further, Japanese Unexamined Patent Application Publication No. 10-62476 discloses a structure in which solder resist is not formed on the wiring pattern for detecting deterioration in the first place.

Deterioration of a printed board due to mist of cutting liquid or the like is significant particularly in areas where mist is easily accumulated. Therefore, the wiring pattern for detecting deterioration is not necessarily deteriorated first even in the cases where solder resist on the wiring pattern for detecting deterioration is formed thin, solder resist is not formed, or a width or an insulating gap of the wiring pattern is made narrower as in the prior art, and there is a problem that guideline of preventive maintenance for the printed board is difficult to be obtained. Further, there is a problem that yield in a printed board manufacturing process is reduced when the pattern width or the insulating gap is made extremely narrower than the regular wiring pattern.

SUMMARY OF THE INVENTION

It is an object of the present invention to provide a printed board capable of detecting deterioration early in consideration of the above-described problems in the prior art. Further, it is another object of the present invention to provide a manufacturing method of a printed board having a wiring pattern for detecting deterioration capable of suppressing reduction of yield in a printed board manufacturing process to a minimum limit. A printed board with a wiring pattern for detecting deterioration by the present invention is a printed board including: an insulating substrate; a wiring pattern group that is formed on the insulating substrate and includes a wiring pattern for detecting deterioration which detects a degree of deterioration of the printed board; and solder resist covering the wiring pattern group, and has a thin film section in which a thickness of the solder resist from the insulating substrate surface is small, and a thick film section in which the thickness of the solder resist is larger than the thin film section, and the wiring pattern for detecting deterioration is formed in the thin film section whose entire surrounding area or partial surrounding area is surrounded by the thick film section.

It can be assumed that the thickness of the solder resist of the thin film section is made smaller than the thickness of the wiring pattern of the wiring pattern group.

It can be assumed that a width of the wiring pattern for detecting deterioration is made narrower than a width of another wiring pattern in the wiring pattern group.

It can be assumed that part or all of the thin film section and the thick film section are formed apart from each other.

The printed board with a wiring pattern for detecting deterioration by the present invention includes: an insulating substrate; a wiring pattern group that is formed on the insulating substrate and includes a wiring pattern for detecting deterioration which detects a degree of deterioration of the printed board; and solder resist formed on the insulating substrate, in which the wiring pattern for detecting deterioration is formed in a surface region of the insulating substrate whose entire surrounding area or partial surrounding area is surrounded by the solder resist, and all of the wiring pattern for detecting deterioration is not covered by the solder resist.

The printed board with a wiring pattern for detecting deterioration by the present invention includes: an insulating substrate; a wiring pattern group that is formed on the insulating substrate and includes a wiring pattern for detecting deterioration which detects a degree of deterioration of the printed board; and solder resist formed on the insulating substrate, in which the wiring pattern for detecting deterioration is formed on a surface region of the insulating substrate whose entire surrounding area or partial surrounding area is surrounded by the solder resist, and a part of the wiring pattern for detecting deterioration is covered by the solder resist.

It can be assumed that the thickness of solder resist covering a part of the pattern for detecting deterioration is made smaller than the thickness of solder resist forming a region of the wiring pattern for detecting deterioration whose entire surrounding area or partial surrounding area is surrounded by the solder resist.

It can be assumed that the width of the wiring pattern for detecting deterioration is made narrower than the width of another wiring pattern in the wiring pattern group.

It can be assumed that a silk printing layer or an insulating resin material layer is formed on all or a part of the solder resist which is formed so as to surround the wiring pattern for detecting deterioration.

The manufacturing method of a printed board with a wiring pattern for detecting deterioration by the present invention is a method for manufacturing a printed board including: an insulating substrate; and a wiring pattern for detecting deterioration which is formed on the insulating substrate and detects a degree of deterioration of the printed board, and includes: a first step of forming a first solder resist layer having a smaller thickness than the thickness of the wiring pattern for detecting deterioration; and a second step of forming a second solder resist layer on the first solder resist layer so as to surround the entire surrounding area or partial surrounding area of the wiring pattern for detecting deterioration.

The manufacturing method of a printed board with a wiring pattern for detecting deterioration by the present invention is a method for manufacturing a printed board including: an insulating substrate; and a wiring pattern group for detecting deterioration, which includes a wiring pattern for detecting deterioration which is formed on the insulating substrate and detects a degree of deterioration of printed board, in which the method includes: a first step of forming a first solder resist layer covering another wiring pattern except the wiring pattern for detecting deterioration in the wiring pattern group; and a second step of forming a second solder resist layer on a part on the first solder resist layer so as to surround the entire surrounding area or partial surrounding area of the wiring pattern for detecting deterioration.

It can be assumed that the manufacturing method of a printed board with a wiring pattern for detecting deterioration includes a third step of forming a silk printing layer or an insulating resin material layer on all or a part of the second solder resist layer.

The present invention, by including the above-described constitution, can provide a printed board capable of detecting deterioration early. Further, the present invention, by including the above-described steps, can provide a manufacturing method of the printed board with a wiring pattern for detecting deterioration in which reduction of yield in the printed board manufacturing process can be suppressed to a minimum limit.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Hereinafter, a wiring pattern denotes a conductor pattern constituting wirings of a printed board.

First Embodiment

Figure 1:
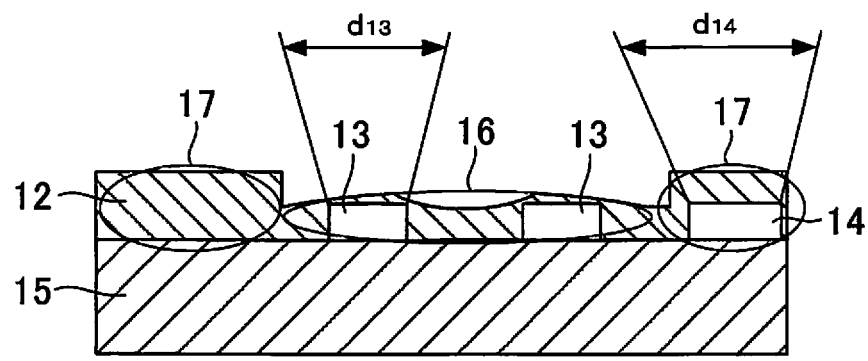
FIG. 1 is a view showing a cross-sectional structure of a printed board in a first embodiment of the present invention.

FIG. 1 shows the first embodiment of the present invention. In a printed board 100, a wiring pattern 13 for detecting deterioration and a wiring pattern 14 other than the wiring pattern for detecting deterioration are formed as a wiring pattern group on a surface of an insulating substrate 15. The same applies to other embodiments. The insulating substrate 15 on which the wiring pattern 13 for detecting deterioration is formed is covered by solder resist 12. The wiring pattern 14 is a conductor pattern provided in order to allow the printed board 100 to constitute an electronic circuit provided with a regular function.

The printed board 100 has a thin film section 16 in which the thickness of the solder resist 12 is smaller than a thick film section 17, and the thick film section 17 in which the thickness is larger than the thin film section 16. The wiring pattern 13 for detecting deterioration is formed in a region (the thin film section 16) surrounded by the thick film section 17. Further, the thickness of solder resist in the thin film section 16 is the thickness of the wiring pattern 13 for detecting deterioration or less. Herein, the film thickness of the thin film section 16 and the thick film section 17 is the distance to a surface of the solder resist 12 by using a surface of the insulating substrate 15 as a reference. Further, a width $d_{13}$ of the wiring pattern 13 for detecting deterioration may be narrower than a width $d_{14}$ of the other wiring pattern 14.

Accumulation of mist or liquid accumulation caused by cutting liquid can be created easily in the region (the thin film section 16) surrounded by the thick film section 17, and the thickness of the solder resist 12 on the wiring pattern 13 for detecting deterioration and corner parts of the wiring pattern 13 for detecting deterioration is thinner than that in a regular wiring pattern, and furthermore, a pattern width is also narrower than the regular wiring pattern, so that large deterioration of electronic properties, which is exceptional in the printed board 100, occurs in the wiring pattern 13 for detecting deterioration, and deterioration of the printed board 100 can be detected early.

As an embodiment of the present invention, a printed board in which part or all of the thin film section 16 in which the thickness of the solder resist 12 is relatively small and the thick film section 17 in which the thickness is relatively large are apart from each other is included.

Second Embodiment

Figure 2:
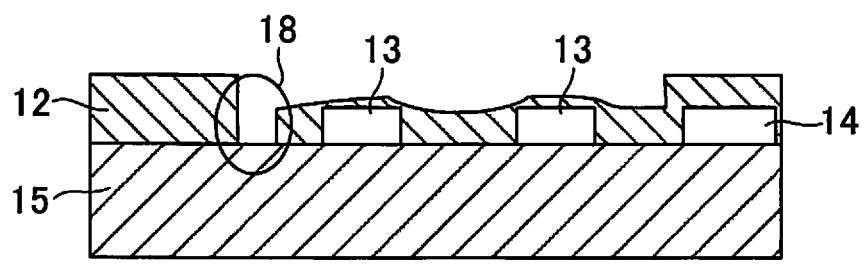
FIG. 2 is a view showing a cross-sectional structure of a printed board in a second embodiment of the present invention.

FIG. 2 shows the second embodiment of the present invention. In a printed board 101, the wiring pattern 13 for detecting deterioration and the wiring pattern 14 other than the wiring pattern for detecting deterioration are formed on the surface of the insulating substrate 15. The printed board 101 has a region 18 where solder resist is not formed between the thin film section 16 and the thick film section 17 of the solder resist 12. In the printed board 101, a volume of a recess surrounded by the thick film section 17 becomes larger comparing to the printed board 100 by an increased amount of the region 18 where the solder resist 12 is not formed. Thus, accumulation of mist or liquid accumulation can be created more easily, and deterioration due to electric corrosion or corrosion becomes even larger.

As an embodiment of the present invention, a printed board having a structure in which the solder resist 12 is not formed on and in the vicinity of the wiring pattern 13 for detecting deterioration is also included.

Third Embodiment

Figure 3:
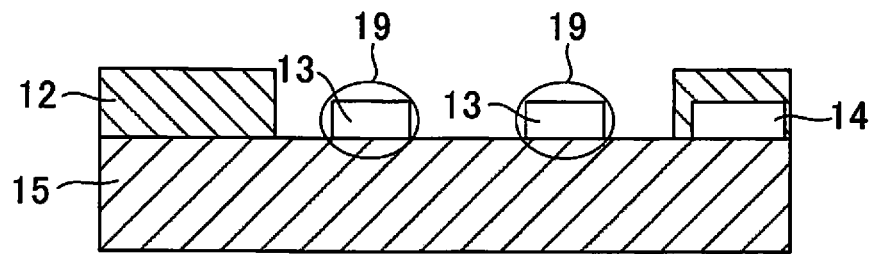
FIG. 3 is a view showing a cross-sectional structure of a printed board in a third embodiment of the present invention.

FIG. 3 shows the third embodiment. In a printed board 102, the wiring pattern 13 for detecting deterioration and the wiring pattern 14 other than the wiring pattern for detecting deterioration are formed on the surface of the insulating substrate 15. In the printed board 102, the wiring pattern 13 for detecting deterioration is provided for a space whose entire surrounding area or partial surrounding area is surrounded by the solder resist 12, but all of the wiring pattern 13 for detecting deterioration is not covered by the solder resist 12. The wiring pattern 13 for detecting deterioration deteriorates early because it is not covered by the solder resist 12 but is exposed. Reference code 19 denotes a wiring pattern for detecting deterioration which is not covered by solder resist.

Fourth Embodiment

Figure 4:
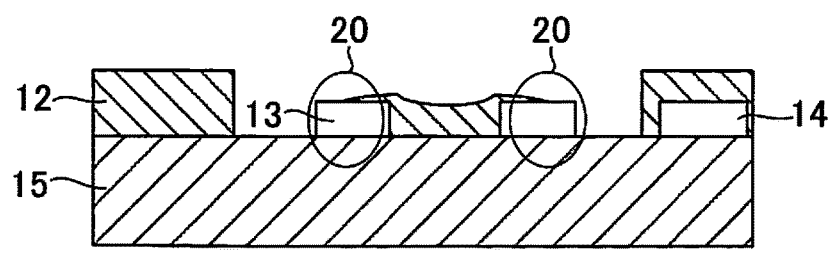
FIG. 4 is a view showing a cross-sectional structure of a printed board in a fourth embodiment of the present invention.

FIG. 4 shows the fourth embodiment. In a printed board 103, the wiring pattern 13 for detecting deterioration and the wiring pattern 14 other than the wiring pattern for detecting deterioration are formed on the surface of the insulating substrate 15. Similar to FIG. 3, in the printed board 103, the wiring pattern 13 for detecting deterioration is provided for a space whose entire surrounding area or partial surrounding area is surrounded by the solder resist 12. Unlike FIG. 3, part of the wiring pattern 13 for detecting deterioration (a portion shown by reference code 20) is covered by the solder resist 12. Reference code 20 denotes a region where a part of the wiring pattern for detecting deterioration is not covered by solder resist.

The thickness of the solder resist 12 formed on the wiring pattern 13 for detecting deterioration is thinner than the thickness of the solder resist 12 which is formed so as to surround the region where the wiring pattern 13 for detecting deterioration is formed. Part of the wiring pattern 13 for detecting deterioration deteriorates early because it is not covered by the solder resist 12 but is exposed.

Fifth Embodiment

Figure 5:
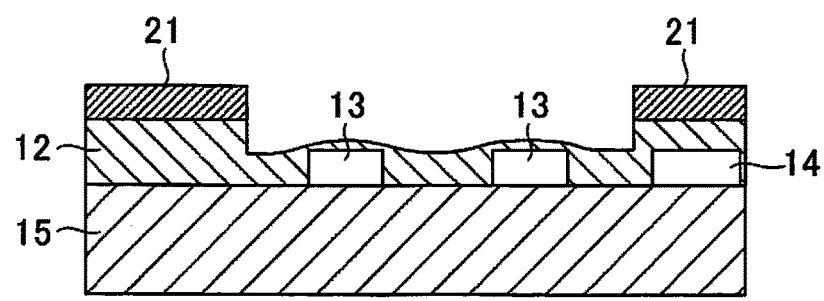
FIG. 5 is a view showing a cross-sectional structure of a printed board in a fifth embodiment of the present invention.

FIG. 5 shows the fifth embodiment. In a printed board 104, the wiring pattern 13 for detecting deterioration and the wiring pattern 14 other than the wiring pattern for detecting deterioration are formed on the surface of the insulating substrate 15. A silk printing layer 21 is formed on a surface of a thick film section of the solder resist 12 which has a solder resist structure similar to FIG. 1 and is formed so as to surround the wiring pattern 13 for detecting deterioration. Accumulation of mist or liquid accumulation can be created more easily by an amount of height increased by the silk printing layer 21, and deterioration due to electric corrosion or corrosion progresses even faster. Note that an insulating resin material other than silk printing may be used as a material formed on the surface of the solder resist 12.

<Manufacturing Method 1>

Figure 6:
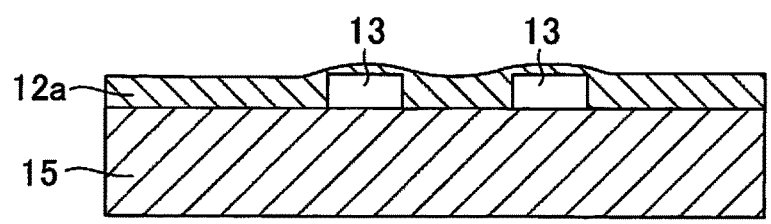
FIG. 6 is a view showing a first step in the first embodiment of the manufacturing method of a printed board according to the present invention.
Figure 7:
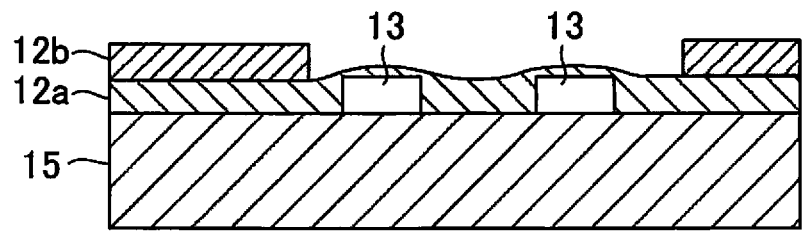
FIG. 7 is a view showing a second step in the first embodiment of the manufacturing method of a printed board according to the present invention.

Next, the manufacturing method of a printed board according to the present invention is shown by using FIG. 6 and FIG. 7. FIG. 6 is a view showing the first step in the manufacturing method of a printed board according to the present invention. FIG. 7 is a view showing the second step in the manufacturing method of a printed board according to the present invention.

A method of one embodiment of the present invention for manufacturing a printed board 105 including: the insulating substrate 15; the wiring pattern 13 for detecting deterioration which is formed on a surface of the insulating substrate 15 and used for detecting a degree of deterioration of the printed board 105; and the solder resist 12 covering the wiring pattern 13 for detecting deterioration includes a first step of forming first solder resist 12a having a smaller thickness than the thickness of the wiring pattern 13 for detecting deterioration, and a second step of forming second solder resist 12b so as to surround the entire surrounding area or partial surrounding area of the wiring pattern 13 for detecting deterioration. Since the first solder resist 12a and the second solder resist 12b have the same material, they have no problem in adhesion.

<Manufacturing Method 2>

Figure 8:
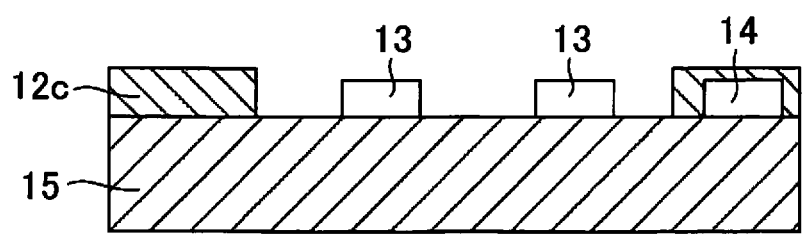
FIG. 8 is a view showing a first step in the second embodiment of the manufacturing method of a printed board according to the present invention.
Figure 9:
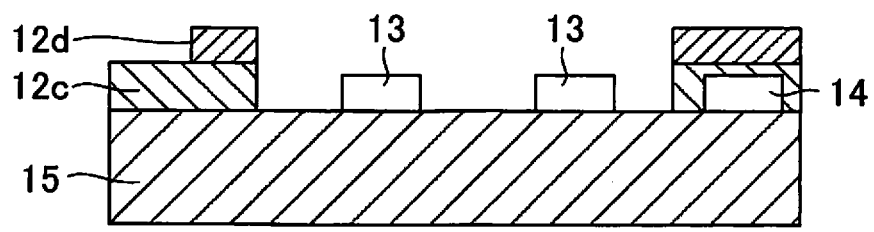
FIG. 9 is a view showing a second step in the second embodiment of the manufacturing method of a printed board according to the present invention.
Figure 10:
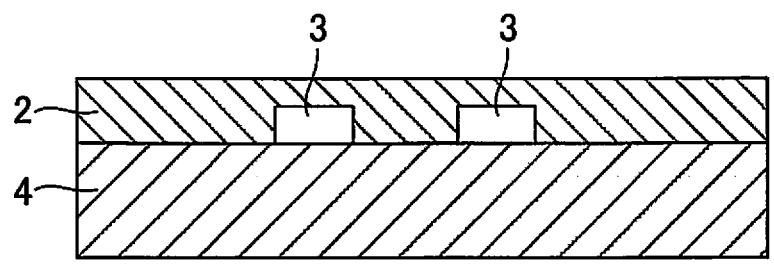
FIG. 10 is a view showing a cross-sectional structure of a printed board including a conventional wiring pattern for detecting deterioration.

Next, another manufacturing method of a printed board according to the present invention is shown by using FIG. 8 and FIG. 9. FIG. 8 is a view showing the first step in the second embodiment of the manufacturing method of a printed board according to the present invention. FIG. 9 is a view showing the second step in a second embodiment of the manufacturing method of a printed board according to the present invention.

A method of the second embodiment of the present invention for manufacturing a printed board 106 including: the insulating substrate 15; and a wiring pattern group constituted by including the wiring pattern 13 for detecting deterioration which is formed on the surface of the insulating substrate 15 and used for detecting a degree of deterioration of the printed board 106, and the wiring pattern 14 other than the wiring pattern for detecting deterioration; and the solder resist 12 formed on the insulating substrate 15 includes a first step of forming first solder resist 12c on the wiring pattern 14 other than the wiring pattern for detecting deterioration, and a second step of forming second solder resist 12d at least in a part on the first solder resist 12c so as to surround the entire surrounding area or partial surrounding area of the wiring pattern 13 for detecting deterioration. Note that embodiments of the present invention are not limited to the drawings shown.

As described above, in the embodiments of the present invention, the thin film section in which the thickness of solder resist is relatively thin and the thick film section in which the thickness is relatively thick are formed, and the wiring pattern for detecting deterioration is formed in the region (thin film section) surrounded by the thick film section. Further, the thickness of solder resist in the region (thin film section) should be the thickness of the wiring pattern for detecting deterioration or less. Furthermore, a pattern width is made thinner limited to the thin film section.

By forming the region (thin film section) surrounded by the thick film section of solder resist in the printed board of the present invention, accumulation of mist or liquid accumulation due to cutting liquid or the like can be created easily in the region, which can be an origin of electric corrosion or corrosion.

Furthermore, by making the thickness of solder resist in the region (thin film section) be the thickness of the wiring pattern for detecting deterioration or less, a solder resist thickness on the wiring pattern and corner parts of the wiring pattern is made thinner, and the width of the wiring pattern for detecting deterioration is made narrower than the regular wiring pattern to promote deterioration due to electric corrosion or corrosion. By promoting deterioration by the above-described structure, large deterioration of electronic properties, which is exceptional in the entire printed board, is generated in the wiring pattern for detecting deterioration, so that deterioration of the printed board can be detected early. Further, by making the pattern width narrower limited to the thin film section where the wiring pattern for detecting deterioration is formed, reduction of yield in the printed board manufacturing process can be suppressed to a minimum limit.

The invention claimed is:

1. A printed board with a wiring pattern for detecting deterioration, comprising:
   an insulating substrate;
   a wiring pattern group that is formed on the insulating substrate and includes a wiring pattern for detecting deterioration which detects a degree of deterioration of the printed board; and
   solder resist covering the wiring pattern group,
   wherein
   the printed board with a wiring pattern for detecting deterioration has:
      a thin film section in which a thickness of the solder resist from the insulating substrate surface is small; and
      a thick film section in which the thickness of the solder resist is larger than the thin film section, and
   the wiring pattern for detecting deterioration is formed in the thin film section whose entire surrounding area or partial surrounding area is surrounded by the thick film section.

2. The printed board with a wiring pattern for detecting deterioration according to claim 1, wherein
   the thickness of the solder resist in the thin film section is smaller than the thickness of the wiring pattern of the wiring pattern group.

3. The printed board with a wiring pattern for detecting deterioration according to claim 1, wherein
   a width of the wiring pattern for detecting deterioration is narrower than a width of another wiring pattern in the wiring pattern group.

4. The printed board with a wiring pattern for detecting deterioration according to claim 1, wherein
   part or all of the thin film section and the thick film section are formed apart from each other.

5. The printed board with a wiring pattern for detecting deterioration according to claim 1, wherein
   a silk printing layer or an insulating resin material layer is formed on all or a part of the solder resist which is formed so as to surround the wiring pattern for detecting deterioration.

6. A printed board with a wiring pattern for detecting deterioration, comprising:
   an insulating substrate;
   a wiring pattern group that is formed on the insulating substrate and includes a wiring pattern for detecting deterioration which detects a degree of deterioration of the printed board; and
   solder resist formed on the insulating substrate,
   wherein
   the wiring pattern for detecting deterioration is formed on a surface region of the insulating substrate whose entire surrounding area or partial surrounding area is surrounded by the solder resist, and
   an entirety of the wiring pattern for detecting deterioration is not covered by the solder resist.

7. The printed board with a wiring pattern for detecting deterioration according to claim 6, wherein
   the width of the wiring pattern for detecting deterioration is narrower than the width of another wiring pattern in the wiring pattern group.

8. A printed board with a wiring pattern for detecting deterioration, comprising:
   an insulating substrate;
   a wiring pattern group that is formed on the insulating substrate and includes a wiring pattern for detecting deterioration which detects a degree of deterioration of the printed board; and solder resist formed on the insulating substrate,
   wherein
   the wiring pattern for detecting deterioration is formed on a surface region of the insulating substrate whose entire surrounding area or partial surrounding area is surrounded by the solder resist,
   a part of the wiring pattern for detecting deterioration is covered by the solder resist, and
   a thickness of solder resist covering the part of the wiring pattern for detecting deterioration is smaller than a thickness of solder resist forming a region of the wiring pattern for detecting deterioration whose entire surrounding area or partial surrounding area is surrounded by the solder resist.

9. A method for manufacturing a printed board with a wiring pattern for detecting deterioration which comprises: an insulating substrate; and a wiring pattern for detecting deterioration which is formed on the insulating substrate and detects a degree of deterioration of the printed board, the method including:
   a first step of forming a first solder resist layer having a smaller thickness than the thickness of the wiring pattern for detecting deterioration; and
   a second step of forming a second solder resist layer on the first solder resist layer so as to surround the entire surrounding area or partial surrounding area of the wiring pattern for detecting deterioration.

10. The manufacturing method of a printed board with a wiring pattern for detecting deterioration according to claim 9, the method including:
   a third step of forming a silk printing layer or an insulating resin material layer on all or a part of the second solder resist layer.

11. A method for manufacturing a printed board with a wiring pattern for detecting deterioration which comprises: an insulating substrate; and a wiring pattern group for detecting deterioration including a wiring pattern for detecting deterioration which is formed on the insulating substrate and detects a degree of deterioration of the printed board, the method including:
- a first step of forming a first solder resist layer covering another wiring pattern except the wiring pattern for detecting deterioration in the wiring pattern group; and
- a second step of forming a second solder resist layer on a part on the first solder resist layer so as to surround the entire surrounding area or partial surrounding area of the wiring pattern for detecting deterioration.

* * * * *